United States Patent [19]

Rogers

[11] Patent Number: 5,561,383
[45] Date of Patent: Oct. 1, 1996

[54] SWITCHABLE PEAK/AVERAGE DETECT CIRCUIT

[75] Inventor: Dennis L. Rogers, Croton-on-Hudson, N.Y.

[73] Assignee: International Business Machines Corporation, Armonk, N.Y.

[21] Appl. No.: 334,710

[22] Filed: Nov. 4, 1994

[51] Int. Cl.$^6$ .................................................. H03K 5/00
[52] U.S. Cl. ............................ 327/61; 327/343; 327/344
[58] Field of Search ................................ 327/58, 59, 61, 327/344, 343, 73, 403, 555, 91, 94, 415, 416, 363

[56] References Cited

U.S. PATENT DOCUMENTS

| | | | |
|---|---|---|---|
| 4,400,633 | 8/1983 | Mouri | 327/61 |
| 4,695,742 | 9/1987 | Randall | 327/344 |
| 5,120,995 | 6/1992 | Abdi | 327/61 |
| 5,185,735 | 2/1993 | Ernst | 370/13 |
| 5,216,492 | 6/1993 | Dorrough et al. | 358/10 |
| 5,247,380 | 9/1993 | Lee et al. | 259/118 |
| 5,406,149 | 4/1995 | An et al. | 327/551 |

*Primary Examiner*—Timothy P. Callahan
*Assistant Examiner*—Eunja Shin
*Attorney, Agent, or Firm*—Robert P. Tassinari, Jr.

[57] ABSTRACT

A circuit that can switch between a peak detect and an averaging mode is described. In a preferred embodiment, when the circuit is in a peak detect mode a first transistor is on and a second is off, enabling an amplifier in the circuit to produce a signal representative of the peak value of an input signal. In an averaging mode, the first transistor is off, and a second transistor turns on, disabling the output of the amplifier, and thus enabling the averaging mode components of the invention.

4 Claims, 1 Drawing Sheet

PEAK DETECT

AVERAGING

SWITCHABLE PEAK/AVERAGE DETECT CIRCUIT

FIELD OF THE INVENTION

The invention relates to optical communication systems, and in particular to circuits for data recovery in such systems.

BACKGROUND OF THE INVENTION

In many applications in optical communications it is desirable to have a single circuit that can operate over a wide variety of signal formats. This variety can require different circuitry to set the proper threshold (the level at which a decision is made whether the signal is a one or zero) for data recovery. In most transmission codes which have a zero DC component, this level is equal to the average of the signal and a simple averaging circuit is adequate. For many codes, however, like the PPM encoding used in IR LAN communications and the FDDI code in fiber optic communications, the proper decision point is not equal to the average of the signal. In these cases a common technique is to use the positive and/or minimum peaks of the signal to determine the proper threshold level.

FIG. 1 shows typical peak detect and averaging circuits. In the peak detect circuit, FIG. 1(a), with the arrival of each pulse in the signal a correction is applied through the diode, D1, to supply current to charge the capacitor, C1, until its voltage equals the peak of the signal. The differential amplifier, A1, amplifies the difference between the peak of the signal and the value on the capacitor to improve accuracy. The typical averaging circuit, FIG. 1(b), is simply a resistor and capacitor. The output, taken from the junction of the resistor and the capacitor, represents the average of the signal applied to the other end of the resistor.

It would be desirable if there were a circuit which could operate with both types of code, i.e., one that is capable of detecting both the peak and average values of a signal. Such a circuit would require less space to implement, would be cheaper to build and would require less power than separate circuits.

SUMMARY OF THE INVENTION

The invention is a switchable circuit for selectively performing an averaging function and a peak detect function, comprising:

first and second complementary switches each having an input and an output and each being actuable by a common switching input, the first switch being on and the second being off when the switching input has a first value, and the first switch being off and the second being on when the switching input has a second value;

an amplifier having an output, and also having an input coupled to the output of the first switch and a complementary input coupled to the output of the second switch;

an output node coupled to the output of the amplifier;

first means, when the first switch is on, for producing at the output node a signal representing the peak value of a signal applied to the input of the first switch;

second means, when the second switch is on, for producing at the output node a signal representing the average value of a signal applied to the input of the second switch.

FIGURES

DETAILED DESCRIPTION

Figure 1A:
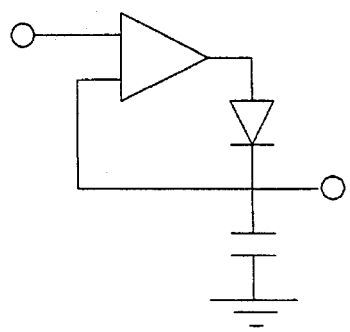
FIG. 1 shows separate peak detecting and averaging circuits in accordance with the prior art.
Figure 1B:
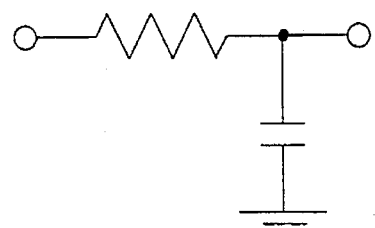
Figure 2:
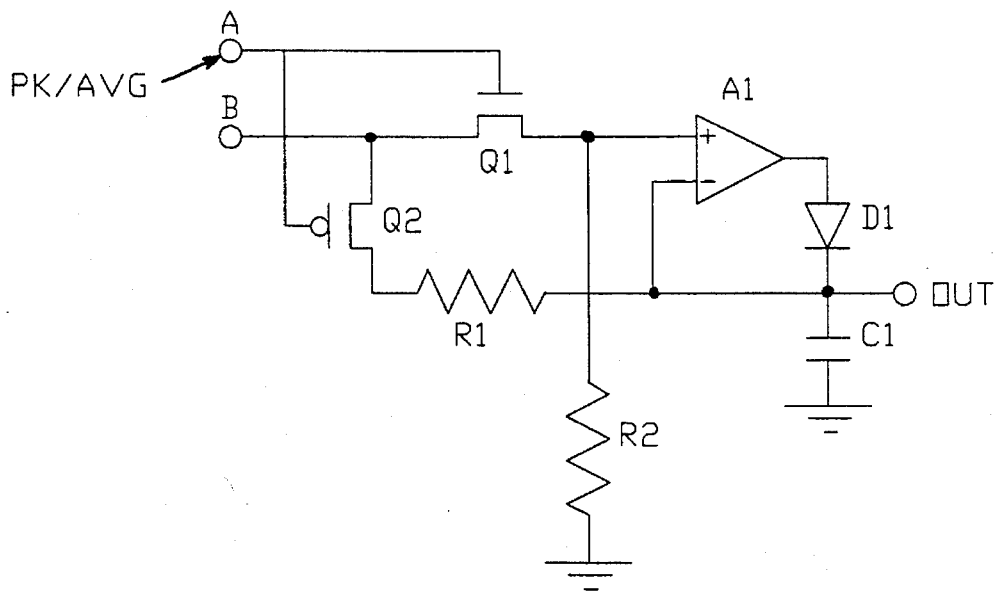
FIG. 2 is a switchable peak/average detect circuit in accordance with the present invention.

FIG. 2 shows a preferred embodiment of the circuit of the present invention. The novel circuit combines the averaging and peak detect functions into a single circuit. This circuit can be switched from peak to averaging mode using the signal labeled "pk/avg" at input A. The signal to be processed appears at input B. In peak detect mode, the n channel FET Q1 is on and the p channel FET Q2 is off, causing the circuit to operate in the same way as the peak detect circuit of FIG. 1(a). In averaging mode, Q1 is off while Q2 is on, connecting the signal through resistor R1 to the capacitor C1, thus forming an averaging circuit, the output of which appears at output OUT. While in this averaging mode, the positive input of A1 is brought low either by a resistor, R2, or the normal leakage currents at the input of the A1. This, in turn, causes the output of A1 to go low, reverse biasing D1, effectively disconnecting A1 from C1. Also, if R1 is chosen small compared to the high impedance of negative input to A1, the time constant of the averaging circuit is simply Ri*C1, which can be accurately controlled.

Figure 3:
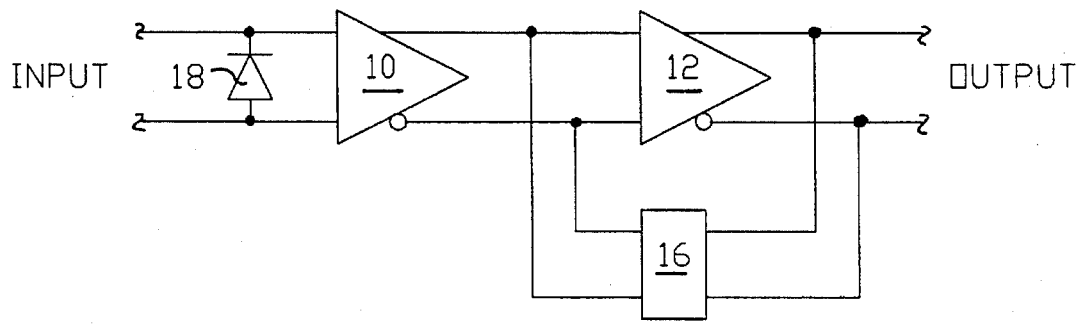
FIG. 3 is an example of an application using the circuit of FIG. 2.

An example of an application using the circuit of the invention is shown in FIG. 3. FIG. 3 is a block diagram of an IR transceiver having, for example, a photodiode 18. In this circuit, the photocurrent signal first passes through a low noise preamplifier 10, then through a high gain postamplifier 12, and finally through a comparator 14 performing the action, analog-to-digital logic of the circuit. The actual decision level is set by a level restore circuit 16, which employs a circuit such as the one in FIG. 2, which monitors the two outputs of the postamplifier 12 and sends a signal back to the input of the postamplifier 12 that adjusts how the postamplifier is balanced.

For zero DC average codes, the level restore circuit 16 measures the difference of the averages of the two postamplifier outputs and feeds back a signal that keeps these two averages the same, resulting in the optimum threshold. For non-zero DC codes, like PPM, the level restore circuit 16 measures the difference of the peaks of the signals at the two postamp outputs and sends this back to the inputs of the postamp.

While the invention has been described in particular with respect to specific embodiments thereof, it will be understood by those skilled in the art that modifications to the preferred embodiments can be made without departing from the spirit and scope of the invention.

I claim:

1. A switchable circuit for selectively performing an averaging function and a peak detect function, comprising:

first and second complementary switches each having an input and an output, wherein the inputs of the first and second complementary switches are connected in, and each being actuable by a common switching input, the first switch being on and the second being off when the common switching input signal has a first value, and the first switch being off and the second being on when the common switching input signal has a second value;

an amplifier having an output, and also having an input coupled to the output of the first switch and a complementary input coupled to the output of the second switch;

an output node coupled to the output of the amplifier;

means, coupled to the output of the amplifier and the complimentary input of the amplifier, responsive to signals at the output of the first switch for producing at the output node a signal representing the peak value of a signal applied to the input of the first and second switches, and responsive to signals at the output of the second switch for producing at the output node a signal representing the average value of a signal applied to the input of the first and second switches.

2. The circuit of claim 1, wherein the means comprises a diode coupled to the output of the amplifier and a capacitor coupled between the diode and ground, wherein the output node is the junction between the capacitor and the diode.

3. The circuit of claim 1, wherein the means comprises a diode coupled to the output of the amplifier and a capacitor coupled between the diode and ground, wherein the output of the second switch is coupled to the junction of the capacitor and the diode, and wherein the output node is the junction between the capacitor and the diode.

4. A switchable circuit for selectively performing an averaging function and a peak detect function, comprising:

first and second complementary switches each having an input and an output, wherein the inputs are connected in common, and each being actuable by a common switching input signal, the first switch being on and the second being off when the common switching input signal has a first value, and the first switch being off and the second switch being on when the common switching input signal has a second value;

an amplifier having an output, and also having an input coupled to the output of the first switch and a complementary input coupled to the output of the second switch;

an output node;

a diode coupled to the output of the amplifier;

a capacitor coupled between the diode and ground;

wherein the output of the second switch is coupled to the junction of the diode and the capacitor, and the output node is the junction between the diode and the capacitor;

whereby when the first switch is on, the circuit produces at the output node a signal representing the peak value of a signal applied to the common input, and when the second switch is on, the circuit produces at the output node a signal representing the average value of a signal applied to the common input.

\* \* \* \* \*